United States Patent [19]

Hughes et al.

[11] Patent Number: 4,897,596
[45] Date of Patent: Jan. 30, 1990

[54] CIRCUIT ARRANGEMENT FOR PROCESSING SAMPLED ANALOGUE ELECTRICAL SIGNALS

[75] Inventors: John B. Hughes, Hove; Ian C. MacBeth, Crawley, both of England

[73] Assignee: U.S. Philips Corporation, New York, N.Y.

[21] Appl. No.: 286,599

[22] Filed: Dec. 16, 1988

[30] Foreign Application Priority Data

Dec. 23, 1987 [GB] United Kingdom ............... 8729987

[51] Int. Cl.⁴ .............................................. G05F 3/24
[52] U.S. Cl. ..................................... 323/315; 323/316
[58] Field of Search ............... 323/311, 313, 314, 315, 323/316, 317; 330/257, 277, 288

[56] References Cited

U.S. PATENT DOCUMENTS

| | | | |
|---|---|---|---|
| 4,247,824 | 1/1981 | Hilbourne | 330/277 |
| 4,297,646 | 10/1981 | Locascio et al. | 330/288 |
| 4,327,321 | 4/1982 | Suzuki et al. | 323/315 |
| 4,412,186 | 10/1983 | Nagano | 330/288 |
| 4,442,398 | 4/1984 | Bertails et al. | 323/315 |
| 4,550,284 | 10/1985 | Sooch | 323/315 |
| 4,583,037 | 4/1986 | Sooch | 323/315 |
| 4,667,180 | 5/1987 | Robinson | 323/316 |
| 4,697,154 | 9/1987 | Kousaka et al. | 323/315 |

OTHER PUBLICATIONS

Fisher et al., "A Highly Linear CMOS Buffer Amplifier", IEEE Journal of Solid-State Circuits, vol. SC-22, No. 3, Jun. 1987, pp. 330-334.

Primary Examiner—Peter S. Wong
Attorney, Agent, or Firm—Bernard Franzblau

[57] ABSTRACT

A circuit arrangement for processing sampled analog electric signals includes a low voltage cascode current mirror circuit arrangement having an input branch comprising first and second FETs (T1,T3) and an output branch comprising third and fourth FETs (T2,T4). In order to provide the correct bias potential of $V_t+2V_{on}$ at the gate electrodes of the second and fourth FETs (T3,T4) a second output branch comprising two further FETs (T5,T6) and a further current mirror circuit comprising two other FETs (T7,T8) pass a current through a diode connected FET (T9) so that it produces a voltage $V_t+V_{on}$. If this current is equal to the input current, then the diode connected FET (T9) is constructed to have a gate width to length ratio of one quarter of that of the cascode connected transistors (T3,T4). The current mirror circuit may be incorporated into current scaling and current memory circuits for signal current manipulation.

16 Claims, 4 Drawing Sheets

CIRCUIT ARRANGEMENT FOR PROCESSING SAMPLED ANALOGUE ELECTRICAL SIGNALS

BACKGROUND OF THE INVENTION

This invention relates to a circuit arrangement for processing sampled analogue electrical signals.

U.S. Pat. No. 4,864,217 (Sept. 15, 1989) and U.S. Pat. No. 4,866,368 (Sept. 12, 1989), the contents of which are hereby incorporated by reference, disclose a method of processing sampled analogue electrical signals in which the electrical quantity manipulated is current. This method is referred to hereinafter as switched current signal processing and circuit arrangements using this method are referred to as switched current circuits. It is known, in switched capacitor circuits, to manipulate electrical charges to perform signal processing of sampled analog electric signals. However, in order to manipulate the charges high quality linear capacitors are required and in MOS integrated circuits these are commonly fabricated using two polysilicon layers. The provision of two polysilicon layers is not a standard part of the CMOS processes usually used for LSI and VLSI digital circuits, which therefore makes the provision of circuits combining analog and digital signal processing on a single integrated circuit more difficult. In addition, the capacitors required for the signal manipulation in switched capacitor circuits occupy a large area which can be half or more of the total chip area. By using switched current circuits the processing and chip area problems may be mitigated. It has been found convenient to use current mirror circuits in the implementation of switched current circuits.

Current mirror circuits are well known in the art and have found uses in various applications. Generally a current mirror circuit comprises a pair of transistors where an input reference current source is connected to drive one of the transistors. The pair of transistors are connected together in a manner whereby the reference current is substantially reproduced or mirrored at the output of the second transistor. In most cases the critical factor in designing a current mirror circuit is providing optimum matching between the reference and output currents. U.S. Pat. No. 4,297,646 issued to LoCascio et al on Oct. 27th 1981 relates to a current mirror circuit comprising bipolar transistors with improved current matching provided by utilizing a single split collector lateral bipolar transistor.

Current mirrors can also be formed using MOS devices. One such arrangement is disclosed in U.S. Pat. No. 4,327,321 issued to H. Suzuki et al on Apr. 27th 1982. The Suzuki et al circuit also includes a resistor in the input rail between the p-channel MOSFET and an n-channel MOSFET to minimize the output current dependency on variations in the power supply voltage. The MOS technology small channel length devices are increasingly in demand. In relation to current mirror circuits the decrease in channel length results in a decrease of the output impendance of the current mirror. Cascoding techniques become necessary in order to increase the output impedance.

The advantages of cascoding transistors to form a stable current mirror circuit are further exemplified in U.S. Pat. No. 4,412,186 issued to K. Nagano on Oct. 25th 1983. Like the LoCascio arrangement, Nagano discloses a current mirror circuit comprising bipolar transistors. In the Nagano arrangement, however, the circuit includes two stages, each having three transistors of one conductivity type and a fourth of the opposite conductivity type. When the four transistors are matched the collector to emitter voltages VCE of the third and fourth transistors are equivalent to their base emitter voltages VDE.

One exemplary MOS circuit arrangement which utilizes cascoding is disclosed in U.S. Pat. No. 4,247,824 issued to R. A. Hilbourne on Jan. 27th 1981. This circuit maintains a high output impedance by utilizing a compensating voltage produced by the connection of an enhancement mode transistor in cascode with a depletion mode transistor.

These and other prior art cascode current mirror arrangements have not been widely used since they often exhibit one or more of the following problems: insufficient maximum voltage swing, excessive power consumption, insufficient output impedance, and inability to be incorporated into integrated circuit designs.

U.S. Pat. No. 4,583,037 claims to address the problem of providing a CMOS current mirror circuit which provides a high input voltage swing and accurate matching between input and output currents over a wide range of processing and temperature variations. However, the CMOS current mirror circuit disclosed in this U.S. Patent has a minimum input voltage of Vt+2Von where Vt is the threshold voltage and Von the turn-on voltage of the transistor.

A current mirror circuit arrangement comprising an input connected to an input branch of a first current mirror circuit, and an output connected to an output circuit branch of the first current mirror circuit wherein the input circuit branch comprises the series arrangement of first and second MOS transistors, the output circuit comprises the series arrangement of third and fourth MOS transistors with the gate electrodes of the first and third transistors connected together and to a bias source such that the first and third transistors are cascode connected, and with the gate electrodes of the third and fourth transistors connected together and to the input is disclosed in a paper entitled "A highly linear CMOS buffer amplifier" by John A. Fisher and Rudolph Koch published in IEEE Journal of Solid State Circuits, Vol. SC-22, No. 3, Jun. 1987, pages 330–334, in particular in FIGS. 1, 4 and 8. As can be seen from FIG. 8 of this paper, the cascode connected transistors M9 and M10 are biased by a fixed bias potential VB2. However, it has been found that, particularly when using source degeneration resistors, as the input current is reduced towards zero the voltage at the drain of transistor M9 approaches the threshold voltage $V_t$ and with a fixed bias potential VB2 transistor M9 can enter its linear region. Under these circumstances, in order to ensure saturation of transistor M9 at low input current levels, it is necessary to use low valued source degeneration resistors which results in poor degeneration and therefore in ineffective stabilisation of the matching, or to use large channel width to length (W/L) ratios which leads to large devices and the occupation of excessive chip areas.

SUMMARY OF THE INVENTION

It is an object of the invention to enable the provision of a circuit arrangement as set forth in the opening paragraph employing a low voltage current mirror circuit arrangement having a high output impedance.

The invention provide a circuit arrangement for processing sampled analog electric signals, each sample being in the form of a current, the circuit arrangement comprising means for combining, in predetermined proportions, the input sample current in the present sample period with current(s) derived from input sample current(s) in one or more preceding sample periods, and means for deriving the processed output signal from the combined current produced by the combining means in successive sample periods. The circuit arrangement includes at least one current mirror circuit arrangement which current mirror circuit arrangement comprises an input connected to an input circuit branch of a first current mirror circuit and an output connected to an output circuit branch of the first current mirror circuit, wherein the input circuit branch comprises the series arrangement of first and second MOS transistors, and the output circuit branch comprises the series arrangement of third and fourth MOS transistors. The gate electrodes of the first and third transistors are connected together and to a bias source such that the first and third transistors are cascode connected, and the gate electrodes of the second and fourth transistors are connected together and to the input. The bias source comprises means for generating a bias current equal to the input current, the bias current generating means comprising a further output branch of the first current mirror circuit, means for applying the bias current to a further diode connected transistor, and means for connecting the drain electrode of the further transistor to the gate electrodes of the cascode connected transistors. The gate width to length ratio of the further transistor and the current through the further transistors are selected so that a voltage of $V_t + 2V_{on}$ is produced across the further transistor, where $V_t$ is the threshold voltage and $V_{on}$ is the saturation voltage.

By ensuring that the bias voltage adapts dynamically to the signal level, it can be ensured that the cascode connected transistors remain saturated regardless of the amplitude of the input signal current and without requiring the provision of low valued source degeneration resistors or large channel width to length ratios.

U.S. Pat. No. 4,583,037 discloses a current mirror circuit, hereinafter referred to as the U.S. circuit, whose bias voltage adapts dynamically to the signal level, but it has a number of disadvantages compared with the current mirror circuit in accordance with the present invention, hereinafter referred to as the present circuit. The input voltage of the U.S. circuit is $V_t + 2V_{on}$ instead of $V_t + V_{on}$ for the present circuit, where $V_t$ is the threshold voltage and $V_{on} = V_{dss} = \sqrt{i/(KW/L)}$ in which i is the input current, W is the channel width of the input transistor, L is the channel length of the input transistor, and K is a constant. Consequently the present circuit can operate with lower supply voltages (for the same input signal range). The input impedance of the U.S. circuit is $d(2V_{on})/di$ compared with $d(V_{on})/di$, i.e. the U.S. circuit impedance is $2/g_m$ instead of $1/g_m$ for the present circuit, where $g_m = 2\sqrt{iKW/L}$. This requires twice the output impedance for the source of the current i to achieve equivalent accuracy. The U.S. circuit requires a capacitor to stabilize the feedback loop because of the high impedance node at the drain electrode of the input cascode connected transistor. The present circuit has no high impedance nodes and so it is naturally stable.

It should further be noted that a current mirror circuit arrangement comprising an input connected to an input circuit branch of a first current mirror circuit and an output connected to an output circuit branch of the first current mirror circuit, wherein the input circuit branch comprises the series arrangement of first and second MOS transistors, the output circuit branch comprises the series arrangement of third and fourth MOS transistors, the gate electrodes of the first and third transistors are connected together and to a bias source such that the first and third transistors are cascode connected and the gate electrodes of the second and fourth transistors are connected together and to the input, in which the bias source comprises means for generating a bias current equal to the input current, the bias current generating means comprising a further output branch of the first current mirror circuit, means for applying the bias current to a further diode connected transistor, and means for connecting the drain electrode of the further transistor to the gate electrodes of the cascode connected transistors is disclosed in a paper entitled "A 50-M bit/sec CMOS Optical Transmitter Integrated Circuit" by Aaron L. Fisher and N. Linde published in IEEE Journal of Solid State Circuits, Vol. SC-21, No. 6, Dec. 1986.

The bias current generating means may further comprise a second current mirror circuit interposed between the further output branch of the first current mirror circuit and the further transistor. The current ratios between the input branch and the output branch of the first current mirror circuit and between the input and output branches of the second current mirror circuit may both be one to one. Source degeneration resistors may be included in each branch of the first current mirror circuit and in series with the further transistor.

One or more further cascode transistors may be included in each of the input and output branches of the first current mirror circuit, the arrangement further including a corresponding number of further bias current generating means each of the same form as the first bias current generating means, wherein each of the further bias current generating means the gate width to length ratio of the further transistor is $1/n^2$ times that of the cascode transistors, where n is equal to 2 plus the number of cascode connected transistors connected between each member of the pair of cascode connected transistors and the first and third transistors.

By including further cascode connected transistors in each branch a further increase in output impedance can be obtained while still retaining an input voltage of $V_t + V_{on}$ if there is provided further bias current generators having the appropriately dimensioned transistors.

The invention further provides a circuit arrangement for processing sampled analogue signals including current scaling circuit.

The invention still further provides a current memory circuit including such a current mirror circuit, the current mirror circuit being modified by including a switch between the gate electrodes of the first and third transistors and a capacitor connected between the gate and source electrodes of the third transistor. The bias current generator may be fed with a current derived from the third transistor. Alternatively, the bias current generator may be fed with a current derived from the first transistor.

The invention further provides an integrator including such a current memory circuit.

BRIEF DESCRIPTION OF THE DRAWING

Embodiments of the invention will now be described, by way of example, with reference to the accompanying drawings, in which.

DESCRIPTION OF THE PREFERRED EMBODIMENTS

Figure 1:
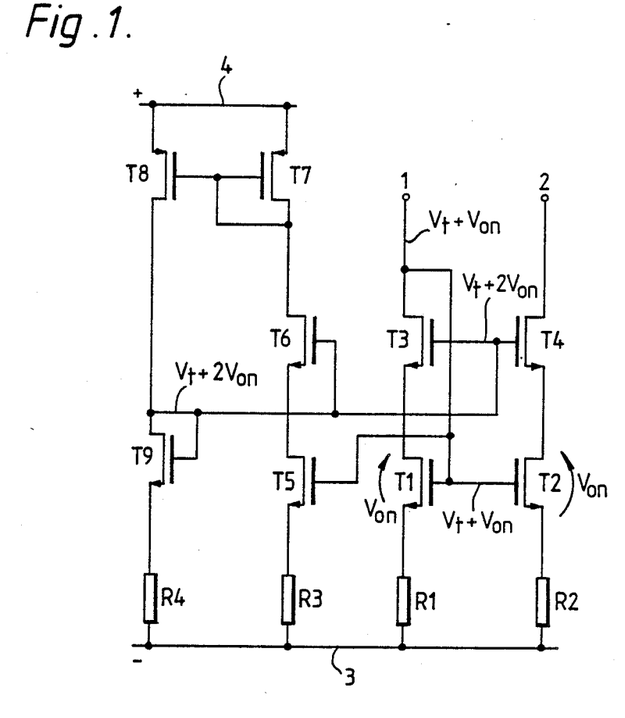
FIG. 1 shows a current mirror circuit for use in a circuit arrangement according to the invention.

The current mirror circuit arrangement shown in FIG. 1 has an input 1 which is connected to the gate electrodes of three n-channel field effect transistors T1, T2, and T5 and to the drain electrode of an n-channel field effect transistor T3. The source electrode of transistor T3 is connected to the drain electrode of transistor T1. The source electrodes of transistors T1, T2 and T5 are connected to a negative supply rail 3 via respective source degeneration resistors R1, R2 and R3. The drain electrode of transistor T2 is connected to the source electrode of an n-channel field effect transistor T4 whose drain electrode is connected to an output 2. The drain electrode of transistor T5 is connected to the source electrode of an n-channel field effect transistor T6 whose drain electrode is connected to the drain electrode of a p-channel field effect transistor T7 whose source electrode is in turn connected to a positive supply rail 4.

The gate electrode of transistor T7 is connected to its drain electrode and to the gate electrode of a p-channel field effect transistor T8 whose source electrode is connected to the positive supply rail 4. The drain electrode of transistor T8 is connected to the drain electrode of an n-channel field effect transistor T9 whose source electrode is connected to the negative supply rail 3 via a resistor R4. The drain electrode of transistor T9 is connected to its gate electrode and to the gate electrodes of transistors T3, T4 and T6. The channel width to length ratio of transistor T9 is one quarter of that of transistors T3, T4 and T6.

The current mirror circuit arrangement shown in FIG. 1 comprises a first current mirror circuit having an input path comprising transistors T1 and T3, a first output branch comprising transistors T2 and T4 and a further output branch comprising transistors T5 and T6. The output from the further output current branch feeds a second current mirror circuit formed by transistors T7 and T8. The output from the second current mirror circuit feeds the diode connected transistor T9 which produces a bias voltage to currectly bias the cascode connected transistors T3, T4 and T6 in the input branch, the first and further output branches, respectively, of the first current mirror circuit. The current ratios between the input branch and the further output branch of the first current mirror circuit is preferably made equal to one to one, as is the current ratio of the second current mirror circuit. This produces a current through the diode connected transistor T9 equal to the input or reference current. As a consequence the following voltages are produced at various points in the circuit arrangement. At the drain electrode of transistor T9 a voltage equal to $V_t+2V_{on}$ is produced and consequently this is the bias voltage which is applied to the gate electrodes of the cascode connected transistors T3 and T4. The voltage between the source and drain electrodes of transistors T1 and T2 is equal to Von and consequently the gate/source voltages of transistors T3 and T4 are equal to $V_t+V_{on}$. The input voltage is equal to $V_t+V_{on}$ since the input is connected to the gate electrodes of transistors T1 and T2. These voltages are of course superimposed on the voltage produced across the source degeneration resistors R1 to R4. This voltage is equal to R times the input current where R is the value of the resistor R1. The values of resistors R1 and R4 are selected to be equal or to be scaled in the inverse proportion to the currents produced in the respective branches of the current mirror circuits. If the current ratios between each of the branches of the current mirror circuit is one to one, then equal values will be chosen for the resistors, whereas if the currents are multiplied then the value of each resistance is divided by the multiplication factor of that branch to produce a constant voltage drop in each branch of the current mirror circuit arrangement.

If the current through transistor T9 is equal to the input current applied to input 1 then its gate width to length ratio should be a quarter of that of the cascode connected transistors T3 and T4. However, if the current through transistor T9 is scaled to be four times the input current then the gate width to length ratio can be equal to that of the cascode connected transistor. Thus by appropriate proportioning of the gate width to length ratio and the current passed through transistor T9 the correct bias voltage $V_t2V_{on}$ can be generated and applied to the gate electrodes of transistors T3 and T4. It should be noted that if a multiplication or scaling factor is required from the current mirror circuit then both transistors T2 and T4 should be appropriately scaled but the bias conditions remain correct since the changed current compensates for the changed dimensions.

Figure 2:
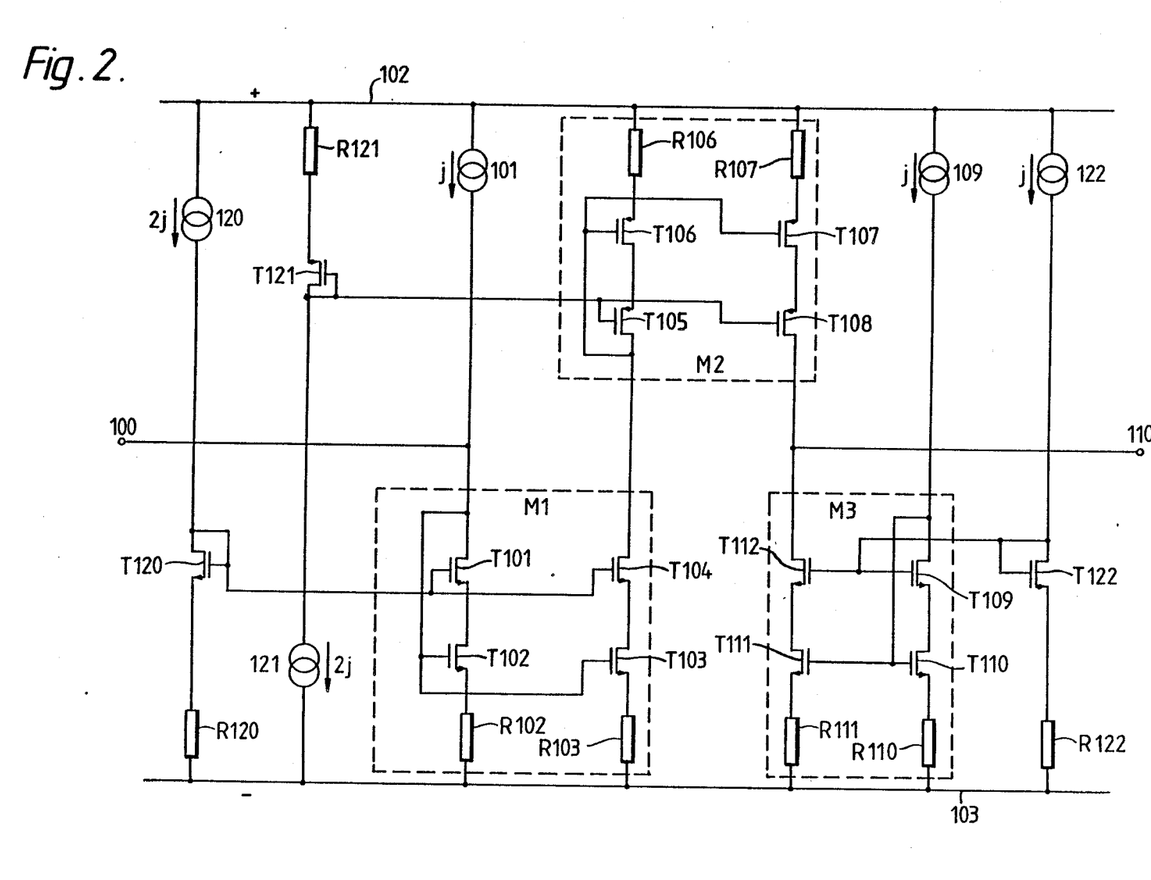
FIG. 2 shows a current scaling circuit using cascoded current mirror circuits with fixed bias potentials.

FIG. 2 shows a current scaling circuit using cascode connected mirror circuits. The scaling circuit shown in FIG. 2 has an input 100 which is connected to the junction of a current source 101 and the drain electrode of an n-channel field effect transistor T101. The other end of the current source 101 is connected to a positive supply rail 102. The drain electrode of transistor T101 is further connected to the gate electrodes of two n-channel field effect transistors T102 and T103. The source electrodes of transistors T102 and T103 are connected to a negative supply rail 103 via respective source degeneration resistors R102 and R103. The drain electrode of transistor T102 is connected to the source electrode of transistor T101 while the drain electrode of transistor T103 is connected to the source electrode of an n-channel field effect transistor T104. Transistors T101 to T104 and resistors R102 and R103 form a first cascode current mirror circuit M1 whose output is available at the drain electrode of transistor T104. The drain electrode of T104 is connected to the drain electrode of a p-channel field effect transistor T105. The drain electrode of transistor T105 is further connected to the gate electrodes of two p-channel field effect transistors T106 and T107 whose source electrodes are connected via respective resistors R106 and R107 to the positive supply rail 102. The drain electrode of transistor T106 is connected to the source electrode of transistor T105 while the drain electrode of transistor T107 is connected to the source electrode of a p-channel field effect transistor T108. The transistors T105 to T108 and resistors R106 and R107 together form a second cascoded current mirror circuit M2 whose output is available at the drain electrode of transistor T108.

A current source 109 is connected between the positive supply rail 102 and the drain electrode of an n-channel field effect transistor T109. The drain electrode of transistor T109 is also connected to the gate electrodes of two n-channel field effect transistor T110 and T111 whose source electrodes are connected via respective source degeneration resistors R110 and R111 to the negative supply rail 103. The drain electrode of transistor T111 is connected to the source electrode of an n-channel field effect transistor T112 while the drain electrode of transistor 110 is connected to the source electrode of transistor T109. The transistors T109 to T112 and the resistors R110 and R111 together form a third cascoded current mirror circuit M3 whose output is available at the drain electrode of transistor 112.

To bias the cascode connected transistors T101 and T104 in the first current mirror circuit M1, a bias chain comprising the series arrangement of a current source 120, an n-channel field effect transistor T120 and a resistor R120 is connected between the positive supply rail 102 and the negative supply rail 103. The current source 120 is connected to the drain and gate electrodes of transistor T120. The gate electrode of transistor T120 is in turn connected to the gate electrodes of transistors T101 and T104. The source electrode of transistor T120 is connected to resistor R120. A similar bias chain comprising a resistor R121, a p-channel field effect transistor T121 and a current source 121 is connected between the positive supply rail 102 and the negative supply rail 103. The gate electrode of transistor T121 is connected to the gate electrodes of transistors T105 and T108. A further bias chain comprising a current source 122, an n-channel field effect transistor T122 and a resistor R122 is connected between the positive supply rail 102 and the negative supply rail 103. The gate electrode of transistor T122 is connected to the gate electrodes of transistors T109 and T112. The outputs of the second and third current mirrors M2 and M3 from the drain electrodes of transistors T108 and T112 are fed to an output terminal 110.

The current source 101 produces a current j to enable bidirectional input currents to be applied to input 100, the permissible range of input currents being ±j. The provision of the current source 101 enables bidirectional input currents to be processed without reverse biasing the input diode of the current mirror M1. In order to produce a suitable bias voltage for the cascode connected transistors T101 and T104 the current source 120 produces the current 2j which is equal to the maximum permissible input current to the current mirror circuit M1. The transistor T120 has a channel width to length ratio one quarter of that of the transistors T101 and T104. The current source 121 also produces a current equal to 2j and the transistor T121 has a channel width to length ratio of one quarter of that of the transistors T105 and T108 in the second current mirror circuit M2. It should be noted that if the current mirror M1 has a non-unity current ratio, then the current produced by the current source 121 should be appropriately scaled so that it is equal to the maximum current to be applied to the current mirror M2. The current source 109 produces the current j. Consequently the current source 122 is also constructed to produce the current j. The transistor T122 has a channel width to length ratio of one quarter of that of transistors T109 and T112. This ensures that the bias voltage produced by transistor T122 is correct for the input current j applied to the third current mirror circuit M3.

An input current i applied to the input 100 produces current i+j at the input of the current mirror M1. As a result the current i+j is produced at the output of the current mirror M1 and applied to the input of the current mirror M2. This current is subsequently reproduced at the output of the current mirror M2. The current j applied to the input of the current mirror M3 is reproduced at the output of the current mirror M3 and subtracts from the current produced by the current mirror M2 so that the output current at output 110 is equal to the input current i. Thus the scaling circuit shown in FIG. 2 can process a bidirectional input current and produce a bidirectional output current, the bias currents being used purely within the scaling circuit shown in FIG. 2.

In order to produce scaled and/or multiple outputs the second and third current mirror circuits M2 and M3 may have a non-unity current ratio between their input and output branches and may have multiple output branches having individually scaled current ratios. It would also be possible to make the current ratio of the first current mirror circuit M1 equal to a factor A but this would require the current source 121 to produce the bias current 2.A.j. This, in itself, would not be a major problem but in a system containing a number of separate scaling circuits it is convenient to use common bias voltage generators and hence it is preferable to restrict the number of different bias voltages required. By giving the first current mirror circuit a unity current ratio only bias currents of j and 2j are required.

The circuit shown in FIG. 2 does not perform well with negative input currents since when small currents are applied to the input of the current mirror circuit M1 the cascode connected transistors T101 and T104 may come out of saturation since the bias conditions are set for the maximum input current of 2j. It should be noted that when the input current approaches −j the current applied to the input of the current mirror M1 approaches zero.

Figure 3:
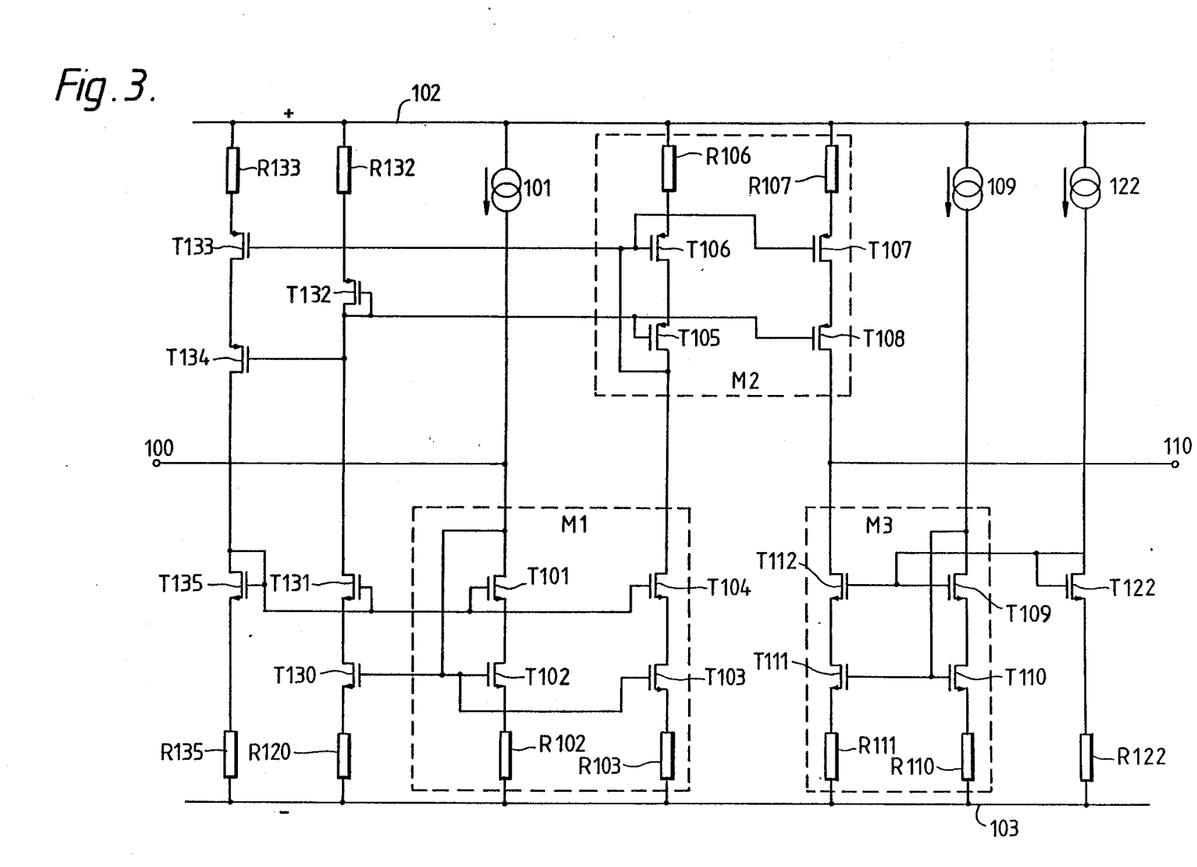
FIG. 3 shows a current scaling circuit using cascoded current mirror circuit arrangements.

FIG. 3 shows scaling circuit according to the invention which is similar to that shown in FIG. 2 but uses current mirror circuits to produce biassing current. In the scaling circuit shown in FIG. 3 elements corresponding to those shown in FIG. 2 are given the same reference symbols. As with the circuit shown in FIG. 2 the input 100 is fed together with the bias current j from the bias source 101 to the input of the current mirror M1. However, the current mirror M1 now includes a further output branch comprising a resistor R130 which is connected between the negative supply rail 103 and the source electrode of an n-channel field effect transistor T130 whose gate electrode is connected to the gate electrode of transistor T102. The drain electrode of transistor T130 is connected to the source electrode of an n-channel field effect transistor T131 whose gate electrode is connected to the gate electrode of transistor T101. The drain electrode of transistor T131 is connected to the drain electrode of a p-channel field effect transistor T132 whose source electrode is connected to the positive supply rail via a resistor R132. The drain electrode of transistor T132 is connected to its gate electrode and to the gate electrodes of transistors T105 and T108. A resistor R133 is connected between the positive supply rail 102 and the source electrode of a p-channel field effect transistor T133 whose gate electrode is connected to the gate electrode of transistor T106 in the second current mirror circuit M2. The drain electrode of transistor T133 is connected to the source electrode of a p-channel field effect transistor T134 whose gate electrode is connected to the gate electrode of transistor T105 in the current mirror M2. The drain electrode of transistor T134 is connected to the drain electrode of an n-channel field effect transistor T135 whose source electrode is connected to the negative supply rail 103 via a resistor R135. The drain electrode of transistor T135 is connected to its gate electrode and to the gate electrodes of transistors T101, T104 and T131. The bias chain comprising current source 120, transistor T120 and resistor R120, and the bias chain comprising resistor R121, transistor T121 and current source 121 shown in FIG. 2 are omitted in the scaling circuit shown in FIG. 3.

In operation when an input current i is fed to the input 100 a current j+i is applied to the input of the current mirror circuit M1. As a result a current j+i is produced at the output of the current circuit mirror M1, that is at the drain electrode of transistor T104. An equal current j+i is produced at the second output branch of the current mirror circuit M1, that is the drain of transistor T131. This current, j+i, is fed to the diode connected transistor T132 which produces the correct bias current for the current mirror M2 since an equal current j+i is applied to the input of the current mirror circuit M2 and the channel width to length ratio of transistor T132 is chosen to be one quarter of that of transistors T105 and T108. When the current j+i is applied to the input of the current mirror circuit M2 the current A(j+i) is produced at the output of the current mirror circuit M2, that is at the drain of transistor T108. However, the current j+i equal to the current in the input branch of the current mirror circuit M2 is produced in the second output branch of the current mirror circuit M2, that is at the drain of transistor T134 and is applied to the diode connected transistor T135. Consequently, since the channel width to length ratio of transistor T135 is chosen to be one quarter of that of transistors T101 and T104, the transistor T135 produces the correct bias voltage for the cascode connected transistors in the current mirror circuit M1. In the current mirror circuit M3, to which a constant current j is applied, a second constant current is applied to the transistor T122 to produce the correct bias voltage for the cascode connected transistors T109 and T112. The current mirror circuits M2 and M3 are arranged to give a current multiplication factor of A and consequently the output current from the scaling circuit is equal to A.i. Multiple outputs can be provided by forming the current mirror circuits M2 and M3 with multiple output branches whose current ratios may be independently chosen to give the required current scaling factors. The branches of the current mirror circuits M2 and M3 which are connected to the same output must, of course, have the same scaling factor.

A comparison of FIGS. 1 and 3 shows that the current mirror circuit arrangement of FIG. 1 comprises two complementary current mirror circuits and that the scaling circuit of FIG. 3 includes complementary current mirror circuits M1 and M2. Thus the further output branch comprising transistors T133 and T134 of the current mirror circuit M2 produces the bias current for the diode connected transistor T135 which generates the bias voltage for the cascode connected transistors T101 and T104 in the current mirror circuit M1. Similarly the further output branch comprising transistors T130 and T131 of the current mirror circuit M1 produces the bias current for the diode connected transistor T132 which generates the bias voltage for the cascode connected transistors T105 and T108 in the current mirror circuit M2. The current ratios between the input branches of current mirror circuits M1 and M2 and their respective further output branches are selected to produce the desired bias currents for the respective bias voltage generators comprising the diode connected transistors T132 and T135. Clearly if the current mirror circuit M1 had a current ratio of A between its input and output branches the current mirror circuit M2 would have to have a current ratio of 1/A between its input branch and its further output branch in order to feed the required bias current to the diode connected transistor T135. Similarly the current ratio between the input branch of current mirror circuit M1 and its further output branch would also have to be A in order to generate the required current for feeding to the diode connected transistor T132 to generate the correct bias potential for transistors T105 and T108. Alternatively of course the current mirror circuits M1 and M2 could each include a further current mirror circuit eliminating the cross coupling between the current mirror circuits M1 and M2.

Figure 4:
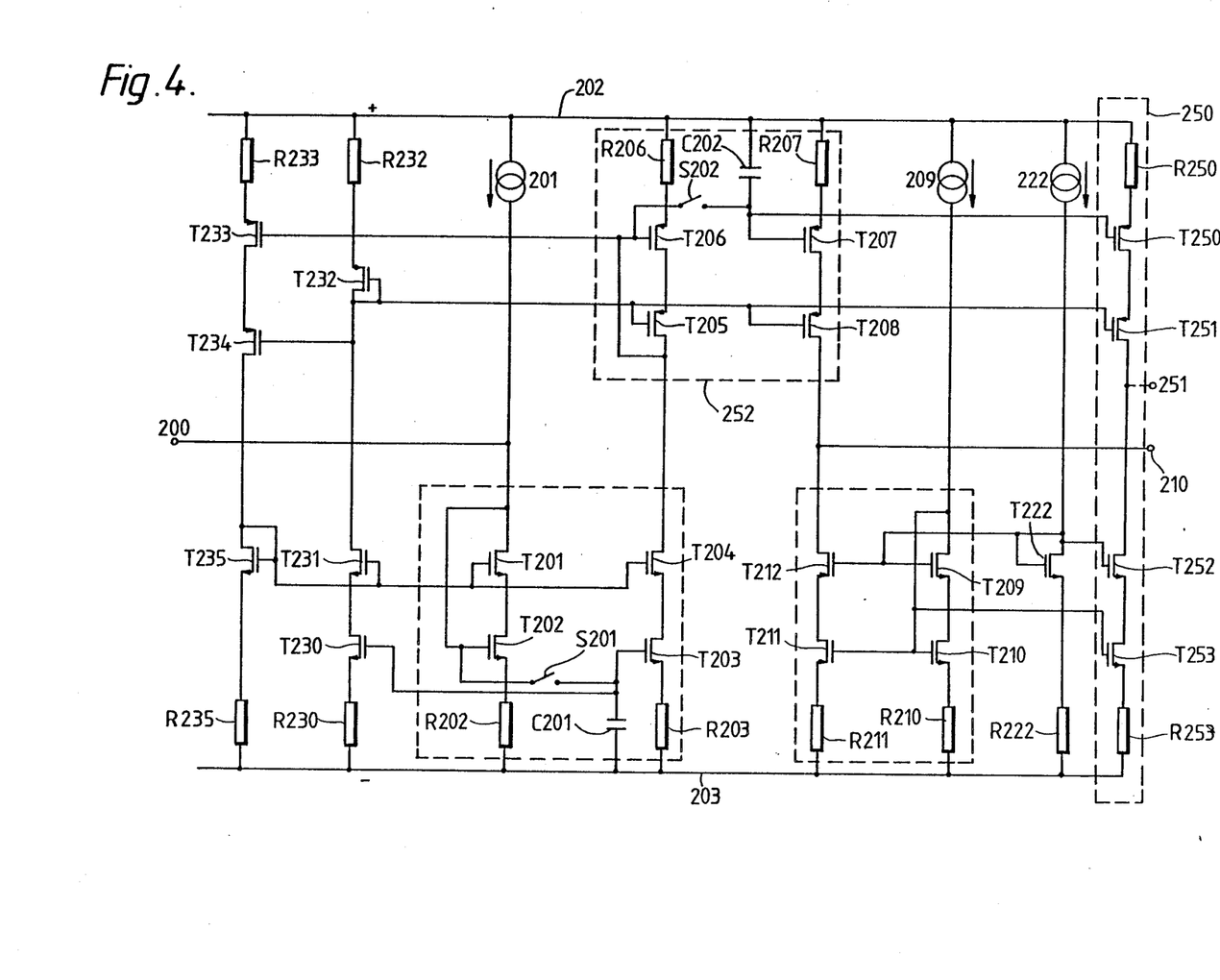
FIG. 4 shows a current memory circuit according to the invention using cascoded current mirror circuit arrangements.

FIG. 4 shows a current memory circuit according to the invention using adapted current mirror circuits of the form shown in FIG. 1. The current memory circuit shown in FIG. 4 has an input 200 which is connected to the junction of a current source 201 and the drain electrode of an n-channel field effect transistor T201. The other end of the current source 201 is connected to a positive supply rail 202 while the drain electrode of transistor T201 is connected to the gate electrode of an n-channel field effect transistor T202 and to one end of a switch S201. The source electrode of transistor T202 is connected to the negative supply rail 203 via a source degeneration resistor R202 while the drain electrode of transistor T202 is connected to the source electrode of transistor T201. The other end of the switch S201 is connected to the junction of a capacitor C201, the gate electrode of an n-channel field effect transistor T230 and to the gate electrode of an n-channel field effect transistor T230. The other end of the capacitor C201 is connected to the negative supply rail 203. The source electrode of transistor T203 is connected to the negative supply rail 203 via a source degeneration resistor R203 while its drain electrode is connected to the source electrode of an n-channel field effect transistor T204. The transistors T201 to T204, the resistors R202 and R203 together with the switch s201 and capacitor c201 form a current memory cell. The output of the current memory cell is available at the drain electrode of transistor T204.

The output from the drain electrode of transistor T204 in the first memory cell is fed to the drain electrode of a p-channel field effect transistor T205. The drain electrode of transistor T205 is connected to the gate electrodes of two p-channel field effect transistors T206 and T233 and to one end of a switch S202. The source electrode of transistor T205 is connected to the drain electrode of transistor T206 whose source electrode is connected via a degeneration resistor R206 to the positive supply rail 202. The other end of the switch S202 is connected to the gate electrode of a p-channel field effect transistor T207 and to one end of a capacitor C202 whose other end is connected to the positive supply rail 202. The source electrode of transistor T207 is connected to the positive supply rail 202 via a source degeneration resistor R207. The drain electrode of transistor T207 is connected to the source electrode of a p-channel field effect transistor T208 whose drain electrode forms the output of a second current memory cell.

A series arrangement of a resistor R233, the source drain path of a p-channel field effect transistor T233, the source drain path of a p-channel field effect transistor T234, the source drain path of an n-channel field effect transistor T235 and a resistor R235 is connected between the positive supply rail 202 and the negative supply rail 203. The drain electrode of transistor T235 is connected to its gate electrode and to the gate electrodes of transistors T201 and T204. Thus the transistors T201 and T204 are cascode connected and receive a gate bias potential via the diode connected transistor T235. A series arrangement of a resistor R232, the source-drain path of a p-channel field effect transistor T232, the source-drain path of an n-channel field effect transistor T231, the source-drain path of an n-channel field effect transistor T230 and a resistor R230 is connected between the positive supply rail and the negative supply rail 203. The gate and drain electrodes of transistor T232 are connected to the gate electrodes of transistors T205 and T208. Thus the transistors T205 and T208 in the second current memory cell are cascode connected and receive a bias voltage via a p-channel field effect transistor T232. In addition the gate electrode of transistor T232 is connected to the gate electrode of transistor T234 and the gate electrode of transistor T235 is connected to the gate electrode of transistor T231. Consequently transistors T234 and T231 are also cascode connected and receive their bias potentials from transistors T232 and T235 respectively.

A current source 209 is connected between the positive supply rail 202 and the drain electrode of an n-channel field effect transistor T209. The drain electrode of transistor T209 is further connected to the gate electrodes of two n-channel field effect transistors T210 and T211. The source electrodes of transistors T210 and T211 are connected via respective source degeneration resistors R210 and R211 to the negative supply rail 203. The drain electrode of transistor T210 is connected to the source electrode of transistor 209 while the drain electrode of transistor T211 is connected to the source electrode of an n-channel field effect transistor T212. A current source 222 is connected between the positive supply rail 202 and the drain electrode of an n-channel field effect transistor T222 whose source electrode is connected to the negative supply rail 203 via a source degeneration resistor R222. The drain electrode of transistor T222 is connected to its gate electrode and to the gate electrodes of transistors T209 and T212. The drain electrode of transistor T212 forms the output of a current mirror circuit formed by transistors T209 to T212 and resistors R210 and R211.

The current sources 201, 209 and 222 all produce a current j. The transistor T235 has a channel width to length ratio of one quarter of that of transistors T201, T204 and T231 while the transistor T232 has a channel width to length ratio of one quarter of that of transistors T205, T208 and T234.

Figure 5:
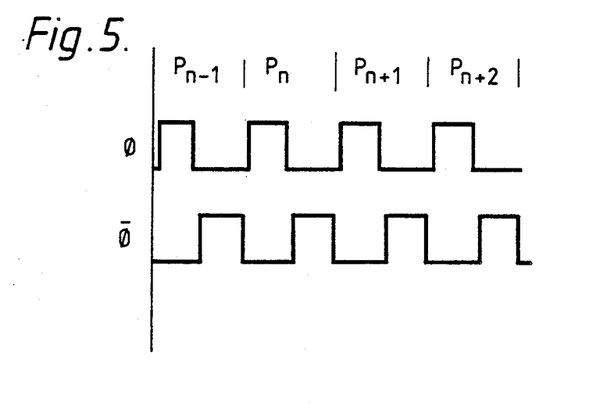
FIG. 5 shows clock signals used in the current memory circuit shown in FIG. 4.

The current memory circuit shown in FIG. 4 is arranged to store input current samples for one sampling period. In other words the current presented at input 200 is reproduced at output 210 one sampling period later. To achieve this the switches S201 and S202 are operated by non-overlapping clock signals which operate at the sampling frequency. Thus during a first portion of each sampling period switch S201 is closed and switch S202 is open, whereas during a second period of each sampling period the switch S201 is open and the switch S202 is closed. Appropriate waveforms $\phi$ and $\bar\phi$ are shown in FIG. 5, the switch S201 being closed during the period when the $\phi$ signal is high, hereinafter referred to as the $\phi$ phase, and the switch S202 being closed during the period when the $\bar\phi$ signal is high, hereinafter referred to as the $\bar\phi$ phase.

The circuit operates as follows. During sampling period $P_n$ an input current $i_n$ is applied to input 200. As a result a current $j+i_n$ is fed to the input of the first memory cell which comprises transistors T201 to T204 together with the switch S201 and the capacitor C201. When the switch S201 is closed the first memory cell is equivalent to a current mirror circuit. The capacitor C201 is charged by the current $j+i_n$ until it reaches the gate potential of transistor T202 and subsequently the current $j+i_n$ is mirrored in the output of transistor T203. At the end of the $\phi$ phase of the sampling period $P_n$ the switch S201 opens but the voltage at the gate of transistor T203 is maintained at the value set by the input current $j+i_n$ by the charge on capacitor C201. Hence the current $j+i_n$ is available from the drain electrode of transistor T204 during the $\bar\phi$ phase of the sampling period $P_n$. This current $j+i_n$ is also produced in the second output branch, comprising transistors T230 and T231 of the current mirror circuit and hence is applied to transistor T232 so that it produces the correct voltage for the cascode connected transistors T205 and T208 in the second memory cell.

During the $\bar\phi$ phase of sampling period $P_n$ the switch S202 is closed and hence the memory cell comprising transistors T205 to T208, switch S202 and capacitor C202 forms a current mirror circuit. The capacitor C202 is charged by the input current $j+i_n$ until its voltage reaches the gate potential of transistor T206 and subsequently the output current $j+i_n$ is produced in the drain electrode of transistor T208. At the end of the $\bar\phi$ phase of sampling period $P_n$ the switch S202 opens. The current produced at the drain electrode of transistor T208 is maintained at the value of $j+i_n$ by the charge on capacitor C202.

During the $\phi$ phase of the sampling period $P_{n+1}$ the current $j+i_{n+1}$ is applied to the input of the first memory cell. However, because the switch S202 is open the output of the second memory cell is equal to $j+i_n$ during the period $P_{n+1}$. The current mirror formed by transistors T209 to T212 subtracts the bias current j from the output of the second memory cell and hence the output current at output 210 during the $\phi$ phase of period $P_{n+1}$ is equal to $i_n$. Consequently the sampled input current in period $P_n$ is reproduced at the output in period $P_{n+1}$. In other words the circuit has stored the input current for one sampling period, or has introduced a one sampling period delay.

The bias voltage for the cascode connected transistors T201 and T204 of the first memory cell is derived via the second output branch of the second memory cell. Consequently, for part of the $\phi$ phase of any sampling period the bias on the cascode connected transistors of the first memory cell will be one sampling period out of date. However, the eventual bias voltage will be correct provided that the time taken to charge the capacitor C201 does not occupy the whole of the $\phi$ phase of a sampling period.

The current memory shown in FIG. 4 can be converted into an integrator by utilising the components within the dotted box 250, the dotted connection 252, the dotted output 251 and discarding the solid output 210. The additional circuitry added by the components within the dotted box 250 comprises a resistor R250 connected between the positive supply rail 202 and the source electrode of a p-channel field effect transistor T250 whose gate electrode is connected to the gate electrode of transistor T207. The drain electrode of transistor 250 is connected to the source electrode of a p-channel field effect transistor T251 whose gate electrode is connected to the gate electrode of transistor T208. A resistor R253 is connected between the negative supply rail 203 and the source electrode of an n-channel field effect transistor T253 whose gate electrode is connected to the gate electrode of transistor T210. The drain electrode of transistor T253 is connected to the source electrode of an n-channel field effect transistor T252 whose gate electrode is connected to the gate electrode of transistor T209. The drain electrodes of transistors T251 and T252 are connected to an output 251. A feedback connection 252 is made between the drain electrode of transistor T208 and the drain electrode of transistor T201.

The integrator operates as follows. An input current $i_n$ in the $\phi$ phase of the sampling period $P_n$ is stored in the current memory circuit and is available during the $\bar\phi$ phase of the period $P_{n+1}$ on the feedback path 252. Thus in the $\phi$ phase of the period $P_{n+1}$ the input to the first memory cell is equal to $j+i_n+i_{n+1}$. This current is again stored in the current memory circuit and is available at the output of the second memory cell, on the feedback path 252, during the $\bar\phi$ phase of the sampling period $P_{n+2}$. This current is again fed back to the input to the first memory cell and added to the new input current sample. It should be noted that the bias current j is not fed back because the current mirror circuit formed by transistor T209 to T212 subtracts the bias current j from the output from the second memory cell. The transistors T250 and T251 form a second output branch of the second current memory cell while the transistors T252 and T253 form a second output branch of the current mirror circuit formed by the transistors T209 to T212. The transistors T250 to T253 may be scaled so that the output available at output T251 is equal to A times the integrated value of the input current. The current ratios of the first and second memory cells may differ from unity in order to produce the required response time and to produce, if required, a lossy integrator. Thus a current ratio of less than one for the second memory cell will produce a lossy integrator.

The current scaling circuit and current memory circuit shown in FIGS. 3 and 4 are basic single ended circuits. Fully differential forms could also be implemented using the current mirror circuits shown in FIG. 1. Different forms of scaling and current memory circuits could incorporate one or more of these current mirror circuits. Additionally further techniques known in current mirror circuits could be incorporated, for example dynamic element matching to reduce the effects of device mismatching. Dynamic element matching has been described in an article entitled "Dynamic element Matching puts Trimless Converters on Chip" by Rudy van der Plassche in "Electronics" dated 16th June 1983. Depending on requirements the source degeneration resistors may be omitted. Further cascode connected transistors may be connected in each path in which case further output branches may be provided to enable the further cascode connected transistors to be optimally biassed. If a second pair of cascode connected transistors is used then the bias voltage generator should comprise a diode connected transistor having a channel width to length ratio 1/9th of that of the second pair of cascode connected transistors. For a third pair of cascode connected transistors the channel width to length ratio of the bias voltage generating transistor should be 1/16th of that of the cascode connected transistor. The general formula is that the channel width to length ratio is $1/m^2$, where m is equal to the number of the transistor in the branch counting from the diode connected transistor.

From reading the present disclosure, other modifications will be apparent to persons skilled in the art. Such modifications may involve other features which are already known in the design and use of electrical or electronic circuits and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation of one or more of those features which would be obvious to persons skilled in the art, whether or not it relates to the same invention as presently claimed in any claim and whether or not it mitigates any or all of the same technical problems as does the present invention.

We claim:

1. A circuit arrangement for processing sampled analogue electrical current signals, comprising: means for combining, in predetermined proportions, an input sample current in a present sample period with current(s) derived from input sample current(s) in one or more preceding sample periods, and means for deriving a processed output signal from a combined current produced by the combining means in successive sample periods, at least one current mirror circuit arrangement which comprises an input connected to an input circuit branch of a first current mirror circuit and an output connected to an output circuit branch of the first current mirror circuit, wherein the input circuit branch comprises a series arrangement of first and second MOS transistors, the output circuit branch comprises a series arrangement of third and fourth MOS transistors, gate electrodes of the first and third transistors being connected together and to a bias source, gate electrodes of the second and fourth transistors being connected together and to the input, wherein the bias source comprises means for generating a bias current equal to the input current, the bias current generating means comprising a further output branch of the first current mirror circuit, means for applying the bias current to a diode connected transistor, and means for connecting the drain electrode of the diode connected transistor to the gate electrodes of the first and third transistors, wherein a gate width to length ratio of the diode connected transistor and the current through the diode connected transistor are selected so that a voltage of $V_t + 2V_{on}$ is produced across the diode connected transistor, where $V_t$ is the threshold voltage and $V_{on}$ is the saturation voltage.

2. A circuit arrangement as claimed in claim 1, wherein the bias current generating means further comprises a second current mirror circuit coupled between the further output branch of the first current mirror circuit and the diode connected transistor.

3. A circuit arrangement as claimed in claim 2, wherein current ratios between the input branch and the output branch of said first current mirror circuit and between the input branch and an output branch of the second current mirror circuit are each one to one.

4. A circuit arrangement as claimed in claim 1 including source degeneration resistors in each branch of the first current mirror circuit and in series with the transistors.

5. A circuit arrangement as claimed in claim 1, including one or more further cascode connected transistors in each of the input and output branches of the first current mirror circuit, a corresponding number of further bias current generating means each of the same form as the first bias current generating means, wherein in each of the further bias current generating means gate width to length ratio of the respective diode connected transistor is 1 divided by $n^2$ times that of the cascode transistors, where n is equal to 2 plus the number of cascode connected transistors connected between each member of the pair of cascode connected transistors and the first and third transistors.

6. A circuit arrangement as claimed in claim 1 including a current scaling circuit.

7. A current memory circuit including a current mirror circuit as specified in claim 1, the current mirror circuit further including a switch coupled between the gate electrodes of the first and third transistors and a capacitor connected between the gate and source electrodes of the third transistor.

8. A current memory circuit as claimed in claim 7, wherein the bias current generating means is fed with a current derived from the third transistor.

9. A current memory circuit as claimed in claim 8, wherein the bias current generating means is fed with a current derived from the first transistor.

10. An integrator including a current memory circuit as claimed in claim 7.

11. A circuit arrangement as claimed in claim 2 further comprising respective source degeneration resistors connected in series with the transistors in each branch of the first and second current mirror circuits.

12. A circuit arrangement as claimed in claim 3 further comprising respective source degeneration resistors connected in series with the transistors in each branch of the first and second current mirror circuits.

13. A circuit arrangement as claimed in claim 2 further comprising at least one further cascode connected transistor in each of the input and output branches of the first current mirror circuit, further bias current generating means including a further diode connected transistor having a gate width to length ratio equal to 1 divided by $n_2$ times that of the respective cascode connected transistor, where n is equal to 2 plus the number of cascode connected transistors connected between each member of the pair of cascode connected transistors and the first and third transistors.

14. A current memory circuit including a current mirror circuit as specified in claim 2 wherein the current mirror circuit further comprises: a switch coupled between the gate electrodes of the first and third transistors and a capacitor connected between the gate and source electrodes of the third transistor.

15. A circuit arrangement as claimed in claim 1 wherein the further output branch comprises a series arrangement of fifth and sixth MOS transistors.

16. A circuit arrangement as claimed in claim 1 wherein said first and second MOS transistors are cascode connected and said third and fourth MOS transistors are cascode connected.

* * * * *